(12) United States Patent
Babcock

(10) Patent No.: US 6,576,536 B1
(45) Date of Patent: Jun. 10, 2003

(54) ULTRA NARROW LINES FOR FIELD EFFECT TRANSISTORS

(75) Inventor: Carl P. Babcock, Campbell, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/824,423

(22) Filed: Apr. 2, 2001

(51) Int. Cl.[7] ............................................ H01L 21/3205
(52) U.S. Cl. ........................ 438/585; 438/725; 438/733
(58) Field of Search ................................. 438/301, 733, 438/736, 738, 200, 238, 289, 585, 725

(56) References Cited

U.S. PATENT DOCUMENTS 4,093,503 A * 6/1978 Harris et al.
6,174,818 B1 * 1/2001 Tao et al.

* cited by examiner

Primary Examiner—Trung Dang
(74) Attorney, Agent, or Firm—Foley & Lardner

(57) ABSTRACT

A method of fabricating an ultra narrow gate electrode for an FET and/or a conductive line in an integrated circuit by first forming a mask for the gate electrode and/or conductive line on a semiconductor substrate of minimal width dimension by optical lithography and reducing the width of the mask by laser irradiation with the beam at an angle and the semiconductor substrate rotating at a high rate of speed.

20 Claims, 4 Drawing Sheets

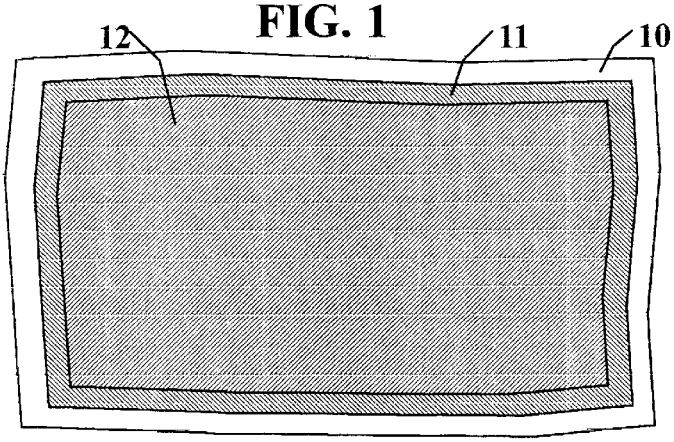
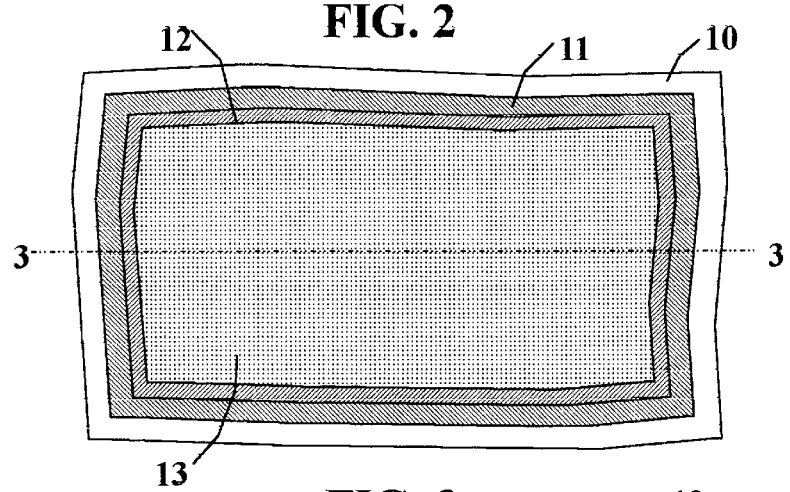
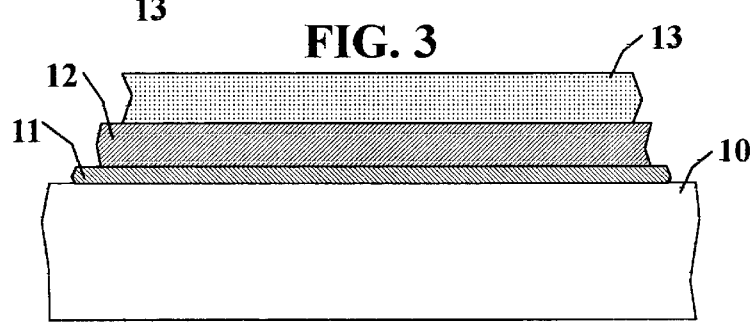
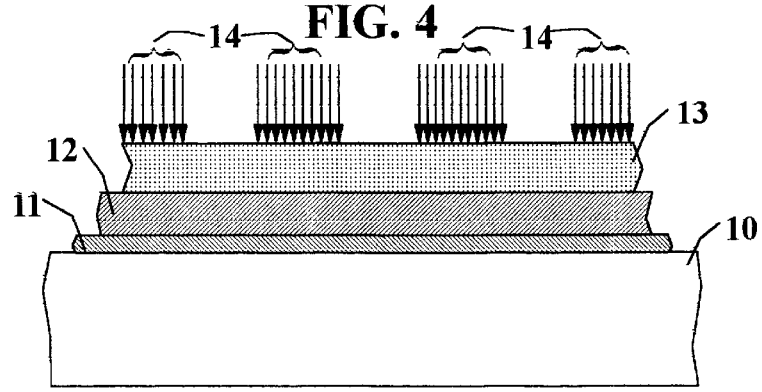

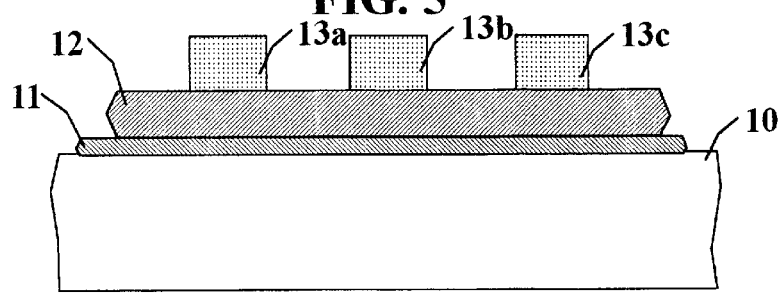
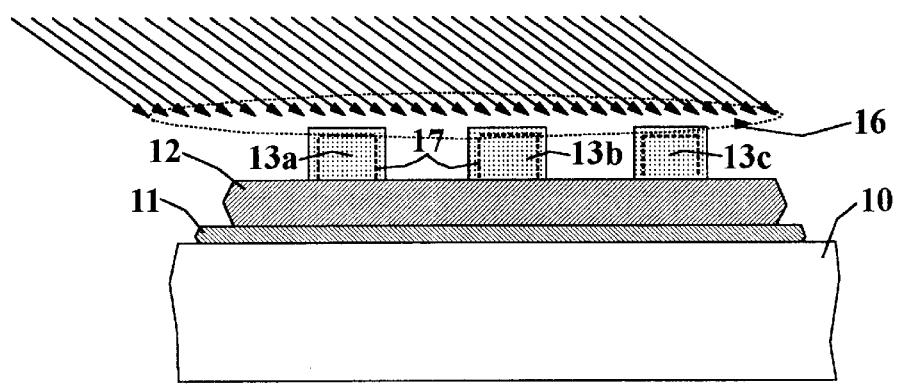
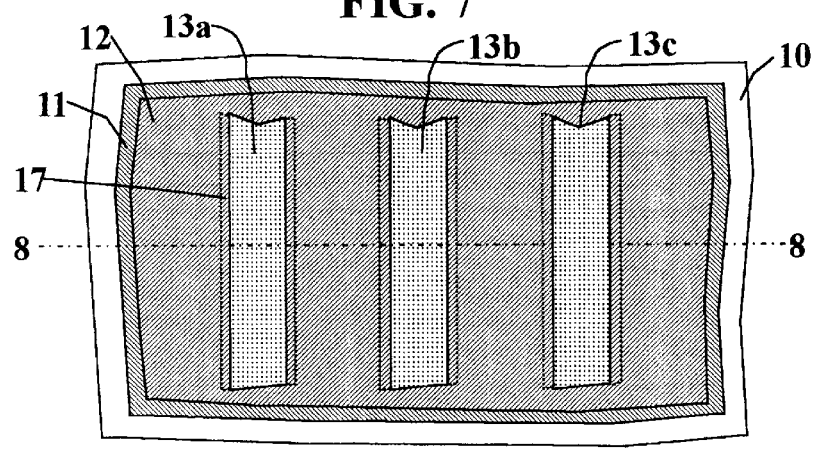
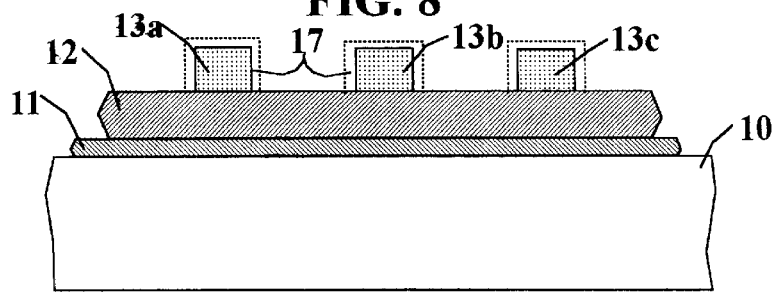

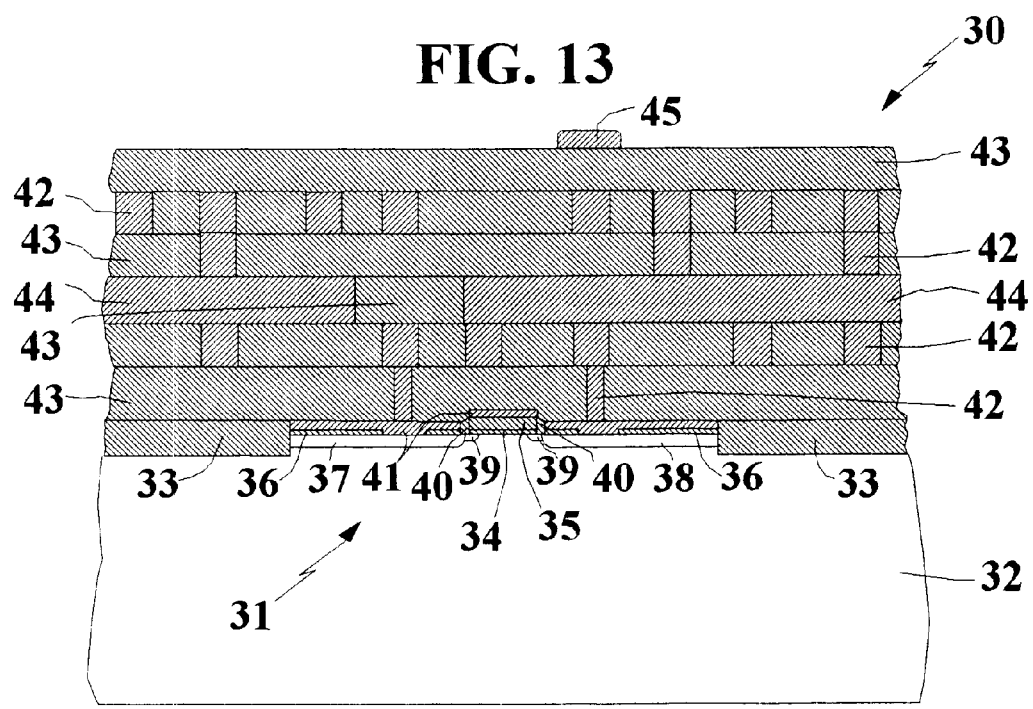

ULTRA NARROW LINES FOR FIELD EFFECT TRANSISTORS

FIELD OF THE INVENTION

The present invention relates to fabricating an integrated circuit with narrow lines and, more specifically, to fabricating a field effect transistor with a narrow gate width and, in addition, narrow interconnecting conductive lines.

BACKGROUND OF THE INVENTION

Field-effect transistor (FET) devices are manufactured by disposing a gate material, such as polysilicon, over a relatively thin gate insulator, such as silicon oxide on and in a semiconductor substrate. The gate material and gate insulator are patterned to form gate conductors, and impurities are deposited adjacent to and on opposite sides of the gate conductors to render the gate material more conductive and to form source/drain regions of either N-type or P-type depending on the type of impurity. If the impurity is N-type, then the resulting FET is an NMOS FET with an N-channel and, if the impurity is a P-type, then the resulting FET is a PMOS FET with a P-channel. In addition, if a device contains both an NMOS and a PMOS, the device is a CMOS.

With the increased need to fabricate more complex and higher levels of integrated circuits with faster FETs, it has become necessary to reduce the FET's threshold voltage, $V_T$. One dimension of the FET which contributes to the $V_T$ is the effective channel length, $L_{eff}$, which, in turn, is influenced by the gate width. The distance between a source and a drain on opposite sides of the gate conductor is the physical channel length and may be considered equivalent to the gate width. After the deposition of the impurities, the actual distance between the source and drain is less than the physical channel length or gate width because of lateral diffusion of the impurities under the gate conductor. As the physical channel length or gate width is reduced in fabrication, the effective channel length, $L_{eff}$, also is reduced in length. Reducing the $L_{eff}$, decreases the distance between the depletion regions associated with the source and drain of the FET. By reducing the physical channel length or gate width and, in turn, the effective channel length, $L_{eff}$, a reduction in the threshold voltage, $V_T$, of the FET can be achieved. Accordingly, the switching speed of the logic gates of an integrated circuit employing FETs with reduced $L_{eff}$ is faster and allows the integrated circuit to quickly transition between logic states.

However, reducing the physical channel length or gate width of an FET is limited by conventional photolithographic techniques used to define the gate width of the gate conductor. Photolithography is used to pattern a photoresist, which is disposed above the gate material, such as polysilicon. An optical image is transferred to and exposes the photoresist by projecting radiation, normally deep ultraviolet light through the transparent portions of a mask plate containing the layout and dimensions of the gate conductor. Depending on whether the photoresist is positive or negative, the solubility of the exposed photoresist is either increased or decreased by a photochemical reaction. The photoresist is developed by dissolving the resist areas of higher solubility with a solvent, leaving a mask pattern on the gate material, such as polysilicon. This mask pattern protects the underlying gate material during etching of the material to define the shape and dimensions of the gate conductor and other lines in an integrated circuit.

Thus, the overlying photoresist pattern defines the lateral width of the gate conductor, which dictates the physical channel length of the FET. The minimum lateral dimension that can be achieved for a patterned photoresist is limited by the resolution of the optical system used to project the image onto the photoresist and, presently, is about 0.13 micron.

Accordingly, it would be desirable to develop an FET fabrication method in which the physical channel length or gate width of the FET can be reduced along with the effective channel length, $L_{eff}$, without being limited by the photolithographic system. A method which avoids the limitations of photolithographic exposure for defining the gate width of gate conductors would allow the effective channel length, $L_{eff}$, of the FET to be scaled down to a smaller size below 0.07 micron as well as other line widths in the integrated circuit. A method for fabricating such an FET and the FET itself would give the integrated circuit designer control over the effective channel length, $L_{eff}$, and allow the designer the ability to design specific operational.

SUMMARY OF THE INVENTION

Accordingly, it is an object of the present invention to provide a method of fabricating an integrated circuit with line widths, such as ultra narrow gate conductors, which permits using normal photolithographic techniques.

Another object of the present invention is to provide a method of fabricating an integrated circuit with ultra narrow gate electrodes and other line widths by a method which does not complicate the overall fabrication method of the integrated circuit.

First, a semiconductor material, such as a silicon wafer, is formed with a layer, such as polysilicon doped with an impurity and capable of functioning as a gate electrode, and with a gate insulating layer, such as an oxide, sandwiched between the silicon surface and the polysilicon. Photoresist is disposed on the polysilicon layer and exposed and developed into a pattern, including gate electrodes of minimal gate width. Now, in accordance with the present invention, the sides and the tops of the photoresist pattern, especially those defining the gate width of gate conductors are reduced in size, preferably by laser ablation, so that the photoresist pattern is reduced to a lesser dimension than that achievable by exposure to an photolithographic system alone. More specifically, a relative motion in the range of about 1000 rpm to about 5000 rpm and a relative relationship of between about 40° and about 80° is established between laser and the silicon wafer to remove photoresist on the top and sides of the photoresist pattern. Preferably, it is the silicon wafer which is spinning at about 4000 rpm in a horizontal position and it is the laser which is at angle of about 60 relative to vertical. The amount of photoresist removed is greater than about 100 Å and may be as much as 500 Å. Depending upon the specific laser, the photoresist is either evaporated or becomes more soluble in a developer or a solvent such as isopropyl alcohol/water. To assist in the decomposition of the photoresist, the laser ablation can be carried out in an oxygen-rich ambient. Next, the photoresist pattern is used as an etch mask and the gate electrode layer and insulating layer are etched to the semiconductor material surface.

BRIEF DESCRIPTION OF THE DRAWINGS

The foregoing and other objects, aspects and advantages will be better understood from the following detailed description of a preferred embodiment of the invention with reference in the drawings, in which:

FIG. 1 is a plan view of a portion of a semiconductor wafer with insulating layer on and in the wafer and a conductive layer on the insulating layer.

FIG. 2 is a plan view of the portion of the semiconductor wafer of FIG. 1 with photoresist layer on the conductive layer.

FIG. 3 is a cross-sectional view of the portion of the semiconductor wafer of FIG. 2 taken along line 3—3 of FIG. 2.

FIG. 4 is a cross-sectional view of the portion of the semiconductor wafer of FIG. 3 with the photoresist layer being selectively radiated through a mask to expose the photoresist.

FIG. 5 is a cross-sectional view of the portion of the semiconductor wafer of FIG. 4 with the photoresist pattern developed.

FIG. 6 is a cross-sectional view of the portion of the semiconductor wafer of FIG. 5 showing the angled beam of a laser irradiating the wafer during relative motion between the laser and the wafer to reduce the tops and sides of the photoresist pattern.

FIG. 7 is a plan view of the portion of the semiconductor wafer of FIG. 6 showing the reduced sides of the photoresist pattern.

FIG. 8 is a cross-sectional view of the portion of the semiconductor wafer taken along line 8—8 of FIG. 7 showing the reduced tops and sides of the photoresist pattern.

FIG. 13 is a cross-sectional view of a portion of an integrated circuit showing an FET with the ultra narrow width gate electrode of the present invention.

DETAILED DESCRIPTION OF THE PREFERRED EMBODIMENTS

Figure 9:
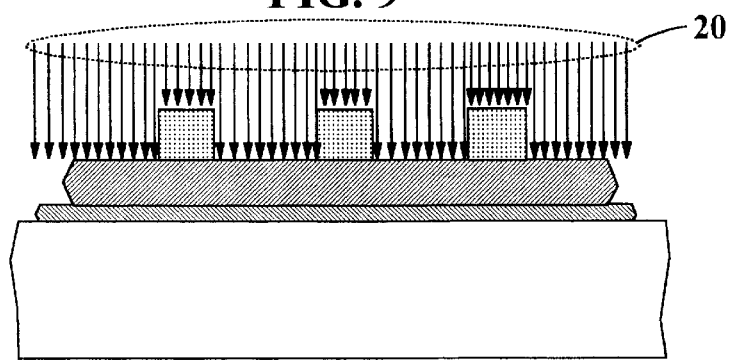
FIG. 9 is a cross-sectional view of the portion of the semiconductor wafer of FIG. 8 with the gate electrode in the process of being etched away in the areas not protected by photoresist.

Since the integrated circuit of the present invention will include field effect transistors (FET), a semiconductor substrate, herein a silicon wafer 10, is shown in FIG. 1, preferably with a {100} plane orientation. The wafer 10 is doped with an appropriate impurity depending on whether the FETs are to be N-type or P-type. If the FETs are to be complementary N-type and P-type, such as a complementary metal oxide silicon (CMOS) FET, selected portions of the wafer 10 will be doped with an appropriate impurity to form wells in the complementary areas. To simplify the description of the present invention, the preferred embodiment of the integrated circuit is an N-type FET and the wafer 10 is doped with a P-type impurity herein boron (B). Also shown in FIG. 2, an insulating layer, which will function as the gate insulator after the FET is fabricated, is formed on the surface of the wafer 10 and preferably is thermally grown silicon oxide 11. On the gate insulating layer 11 is deposited a material, which will function as the gate electrode in the completed FET, and, herein, the material is polysilicon 12 which may be doped with an impurity either during or after deposition to lower the resistivity of the polysilicon and make it conductive. Preferably, the doping of the polysilicon 12 is after it is deposited and, herein, is doped with an N-type impurity, such as arsenic (As), during the formation of the source and drain of the N-type FET.

To form individual gate electrode 12 disposed on a gate insulator, a commercially available deep ultra violet (UV) photoresist layer 13 is deposited on the gate electrode as shown in plan view in FIG. 2 and in cross-sectional view in FIG. 3. The photoresist is exposed to radiant energy, such as deep ultra violet light 14, through a mask pattern (not shown) to chemically change the photoresist to make the photoresist more soluble in the exposed areas as shown in FIG. 4. The photoresist 13 is developed and removed in the light struck areas to leave, as shown in FIG. 5, three individual resist areas 13a, 13b, and 13c. These resist areas protect the gate electrode material 12 and underlying gate insulating material 11 during the subsequent step of etching. Alternatively, the photoresist can be made less soluble when exposed to light so that the exposed areas remain and the unexposed areas are removed during development.

In accordance with the present invention, the individual photoresist areas 13a, 13b and 13c are reduced in size by cutting away the tops 15a, out of necessity, and the sides 15b of the photoresist areas, preferably by laser ablation as shown in FIG. 6, which schematically shows the angled output 16 of a scanning laser ablating the tops and sides of individual photoresist areas 13a, 13b and 13c on the semiconductor wafer 10. The wafer is rotating in the direction of the arrow 17 in the range of about 1000 rpm to about 5000 rpm and, herein, at about 4000 rpm. The laser under computer control (not shown) scans the tops 15a and sides 15b of the photoresist areas 13a, 13b and 13c and irradiates the photoresist with a beam at an angle of from about 40° to about 80°, preferably 60°. Herein, the laser is 248 nm in wavelength within the absorption spectra of the photoresist layer 13, and emits 5.0 eV in photon energy. The laser may be either a pulse type $CO_2$ laser with a wavelength of 10.6 microns or an ArF laser. The laser output 16 is about 350 mJ, assuming the efficiency by 3%, and the relative motion between the laser beam and the semiconductor substrate is shown by the arrow 17. The dashed lines 18 on the tops and sides of photoresist areas 13a, 13b and 13c of FIG. 7 indicate the amount of photoresist removed from the sidewall of the areas, herein about 300 Å. The laser beam output 16 is radiated intermittently with a pulse width of 20 nanoseconds at 1 to 100 Hz, preferably 10 Hz. When the photoresist areas 13a, 13b and 13c are irradiated with the pulsed laser beam output 16, the tops 15a and sides 15b of the photoresist may form into a fine powder (not shown) which is removed before the etching steps of the polysilicon layer 12 and the insulating layer 11. Preferably, if a fine powder results instead of total evaporation, the powder is removed by ultrasonic cleaning at a frequency of about 30 kHz for about 1 to 10 minutes in an aqueous solution of isopropyl alcohol.

Figure 10:
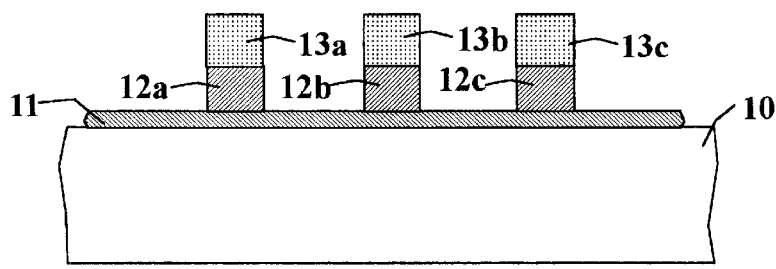
FIG. 10 is a cross-sectional view of the portion of the semiconductor wafer of FIG. 9 with the gate electrode etched away in areas not protected by photoresist.
Figure 11:
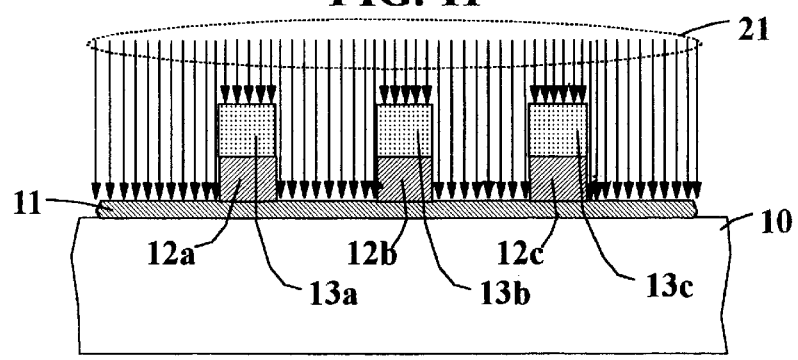
FIG. 11 is a cross-sectional view of the portion of the semiconductor wafer of FIG. 10 with the insulating layer in the process of being etched away in areas not protected by photoresist and the gate electrode.
Figure 12:
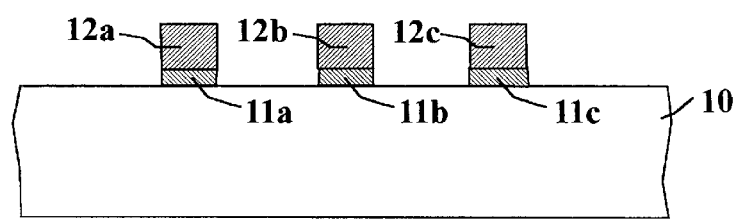
FIG. 12 is a cross-sectional view of the portion of the semiconductor wafer of FIG. 11 with the photoresist removed, leaving the three composites of insulating layer and gate electrode.

Next, to complete gate electrodes 12a, 12b and 12c with underlying gate insulators 11a, 11b and 11c of the same width dimensions as the photoresist areas 13a, 13b and 13c, the polysilicon layer 12 is anisotrophically etched, using the photoresist areas as a mask, in a commercially available parallel plate plasma reactor (not shown) using herein $SF_6{:}Cl_2$ as the plasma gas as shown by the arrows 20 in FIG. 9. The unprotected polysilicon layer 12 is removed as shown in FIG. 10. Next, again using the photoresist areas as a mask as well the etched polysilicon areas 12a, 12b and 12c underlying the photoresist areas, the silicon oxide gate insulator layer 11 is anisotropically etched in the parallel plate plasma reactor, using herein $CF_4:H_2$ as the plasma gas of silicon oxide, as shown by the arrows 21 in FIG. 11. Now, the photoresist areas which served as a mask during etching are removed by ashing in an oxygen atmosphere as is well known in the art. The resulting gate electrodes 20a, 20b and 20c with underlying gate oxide insulating layers 21a, 21b and 21c are shown in FIG. 12.

The other steps in fabricating an FET are well know in the art, but to describe an FET containing ultra narrow width gate electrode, such as gate electrode 20a with its underlying gate insulator 21a, reference will be made to a portion of integrated circuit 30 containing one FET 31, as shown in FIG. 13. A portion of a silicon wafer 32, as exemplary of other parts of the wafer, is divided into trenches 33 which are filled with an insulating material, herein silicon oxide by chemical vapor depositing (CVD).

Next, the above-described process for forming the ultra narrow gate electrode 20a and gate insulator 21a is used to fabricate the gate insulator 34 and gate electrode 35 of FIG. 13. A thin screen oxide 36 preferably is grown prior to implantation of impurities for the source and drain. The oxide also grows a thin layer on the exposed polysilicon sides and repairs any damage to the polysilicon and gate oxide under the polysilicon caused by etching. Once, the gate electrode is formed, impurities are implanted to create the source 37 and drain 38. Because of the short channel length (less than 0.07 of the FET), it is preferable to first implant a lightly doped drain (LDD) 39 as part of the source and drain.

N-type impurities, herein phosphorus (P) are implanted into the silicon 32 with the gate 35 and gate insulator 34 serving as an alignment mask to implant phosphorus ions between the gate and the walls of the trenches 33. Since implant is shallow for the LDD, the dosage parameters for the implant is about $1 \times 10^{13} cm_{-2}$ at energies of 40–60 keV. A conformal layer of silicon oxide is deposited and anisotropically etched to form sidewalls 40, which is used to mask those parts of the silicon wafer to which N-type ions, herein arsenic (As) ions, are implanted to form the source 37 and drain 38. The dosage for this implant is $5 \times 10^{15} cm_{-2}$ at energies of 40–80 keV. The gate electrode 35, herein polysilicon, can be doped with the N-type dopant at the same time as implanting the source and drain.

To enhance the conductivity of the gate 35 and the contact interface of the source 37 and drain 38 with the implanted ions, a metal capable of forming a metal silicate 41, herein titanium (Ti), is blanket deposited as a thin layer of thickness of preferably from about 350 Å to about 500 Å. A rapid thermal anneal at 650° C. for about 15 minutes causes the titanium to react with the silicon wafer 32 and the implanted impurities to activate and diffuse vertically and laterally in the silicon with the resultant profiles as shown in FIG. 13. The unreacted Ti on the trenches and sidewalls is removed by an etchant, herein a sulfuric acid/hydrogen peroxide mixture. Alternatively, ammonium hydroxide may be used.

With the N-type FET formed, an insulating material 43 is deposited over the silicon wafer 32 and planarized by chem/mech polish. Contact holes are anisotropically etched in the insulating material and preferably a liner (not shown) such as Ti/TiN is CVD deposited to line the contact holes followed by filling the holes with a metal 42, such as tungsten, to contact a metallization layer of, for example, aluminum (Al), as exemplified by metal layers 44. The surface of the silicon wafer is again planarized by chem/mech polish and repeated for the desired number of interconnection layers. A pad 45 is shown on the top of the portion of the integrated circuit 30 for interconnecting to a circuit board.

As is well known in the art, patterned metallization layers and insulating layers are formed to interconnect the circuits of the integrated circuit chips or dies to complete the fabrication of the silicon wafer prior to dicing into individual chips. The number of interconnect layers will depend on the circuit density of the integrated circuit on the individual chips or dies of the silicon wafer. However, ultra narrow interconnect lines may be formed using the present invention of reducing the width of the lines by trimming the tops and sides of the photoresist pattern for the lines by, preferably, laser ablation.

By reducing the width of the gate electrode in accordance with the present invention, the effective channel length, $L_{eff}$, of the integrated circuit shown in FIG. 13 is about 0.05 because the physical channel length between the source 37 with its LDD 39 and the drain 38 with its LDD 39 is reduced. Thus, the FET's threshold voltage, VT, is reduced. Accordingly, the switching speed of the logic gates of the integrated circuit of FIG. 13 employing the FET of the present invention with reduced $L_{eff}$ is faster and allows the integrated circuit of FIG. 13 to quickly transition between logic states.

Although this invention has been described relative to specific materials and semiconductor fabricating apparatus for forming integrated circuits on a wafer, it is not limited to the specific materials or apparatus but only to the specific structural characteristics of the integrated circuits and the method of fabricating such integrated circuits required for the present invention. Other materials and apparatus can be substituted for those described herein which will be well understood by those skilled in the microelectronics and semiconductor arts after appreciating the present invention.

What is claimed is:

1. In a process of fabricating a field effect transistor (FET) with an ultra narrow gate electrode, a method comprising the steps of:

forming an insulating layer on a semiconductor substrate;

forming a gate electrode layer on said insulating layer;

forming a mask layer on said electrode layer;

exposing the mask layer to radiation to create a pattern in the mask layer after development including a gate pattern having a width;

reducing the width of the gate pattern by angled laser irradiation; and using said reduced gate pattern as a mask for etching the insulating layer and gate electrode layer thereby creating the ultra narrow gate electrode.

2. The method of claim 1 wherein the width of the gate pattern is reduced by an amount greater than about 100 Å.

3. The method of claim 1 wherein the width of the gate pattern is reduced by a laser beam at an angle of between about 40° to about 80° relative to the semiconductor substrate.

4. The method of claim 1 wherein the laser and the semiconductor substrate are rotating relative to each other at an rpm in the range of about 1000 to about 5000 rpm.

5. The method of claim 4 wherein the laser and the semiconductor substrate are rotating relative to each other at about 4000 rpm.

6. The method of claim 3 wherein the relative angle between the laser beam and the semiconductor substrate is about 60°.

7. A method of fabricating an ultra narrow conductive line in an integrated circuit comprising the steps of:

forming a conductive layer on a semiconductor substrate;

forming a mask layer on said conductive layer;

exposing the mask layer to radiation to create a pattern including at least one conductive line pattern in the mask layer after development, said conductive line pattern having a width; and reducing the width of the conductive line pattern by irradiation with a laser, said laser and said semiconductor substrate being at an angle relative to each other and rotating relative to each other.

8. The method of claim 7 wherein the width of the conductive line pattern is reduced by an amount greater than about 100 Å.

9. The method of claim 7 wherein the width of the conductive line pattern is reduced by a laser beam at an angle of between about 40° to about 80° relative to the semiconductor substrate.

10. The method of claim 7 wherein the laser and the semiconductor substrate are rotating relative to each other at an rpm in the range of about 1000 to about 5000 rpm.

11. The method of claim 7 wherein the laser and the semiconductor substrate are rotating relative to each other at about 4000 rpm.

12. The method of claim 9 wherein the relative angle between the laser beam and the semiconductor substrate is about 60°.

13. A method of fabricating a field effect transistor (FET) on a substrate including a gate electrode layer above the substrate, the method comprises;

forming a mask layer on said electrode layer;

exposing the mask layer to radiation to create a pattern in the mask layer after development including a gate pattern having a width;

reducing the width of the gate pattern by laser irradiation; and using said reduced gate pattern as a mask for etching the gate electrode layer.

14. The method of claim 13 wherein the width of the gate pattern is reduced by an amount greater then about 100 Å.

15. The method of claim 13 wherein the width of the gate pattern is reduced by a laser beam at an angle of between about 40° to about 80° relative to the semiconductor substrate.

16. The method of claim 13 wherein the laser and the semiconductor substrate are rotating relative to each other at an rpm in the range of about 1000 to about 5000 rpm.

17. The method of claim 16 wherein the laser and the semiconductor substrate are rotating relative to each other at about 4000 rpm.

18. The method of claim 15 wherein the relative angle between the laser beam and the semiconductor substrate is about 60°.

19. The method of claim 13 wherein fine powder formed during the reducing step is removed In a cleaning step before the using step.

20. The method of claim 13 wherein the cleaning step is an ultrasonic cleaning process using isopropyl alcohol.

* * * * *